(12) United States Patent
Chen et al.

(10) Patent No.: US 10,470,336 B2
(45) Date of Patent: Nov. 5, 2019

(54) QUICK RELEASE FAN MODULE

(71) Applicant: Quanta Computer Inc., Taoyuan (TW)

(72) Inventors: Chao-Jung Chen, Taoyuan (TW);
Yaw-Tzorng Tsorng, Taoyuan (TW);
Po-Chen Liu, Taoyuan (TW);
Hou-Hsien Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 468 days.

(21) Appl. No.: 15/044,771

(22) Filed: Feb. 16, 2016

(65) Prior Publication Data

US 2017/0042060 A1 Feb. 9, 2017

Related U.S. Application Data

(60) Provisional application No. 62/202,500, filed on Aug. 7, 2015.

(51) Int. Cl.
*F04D 25/06* (2006.01)
*H05K 7/20* (2006.01)
*F04D 29/60* (2006.01)

(52) U.S. Cl.
CPC ..... *H05K 7/20172* (2013.01); *F04D 25/0613* (2013.01); *F04D 29/601* (2013.01)

(58) Field of Classification Search
USPC .............. 415/213.1, 214.1; 361/695, 678.48, 361/679.51
See application file for complete search history.

(56) References Cited

U.S. PATENT DOCUMENTS

| 5,045,960 | A | * | 9/1991 | Eding | G11B 33/02 360/137 |
| 5,359,492 | A | * | 10/1994 | Porter | H05K 7/1405 292/85 |
| 6,139,213 | A | * | 10/2000 | Osborne | F16B 2/06 361/726 |
| 6,168,214 | B1 | * | 1/2001 | Lambert | E05C 3/08 292/100 |
| 6,373,698 | B1 | | 4/2002 | Christensen | |

(Continued)

OTHER PUBLICATIONS

Taiwanese Office Action for Application No. 105110085, dated Mar. 8, 2017, w/ First Office Action Summary.

*Primary Examiner* — Carlos A Rivera
*Assistant Examiner* — Theodore C Ribadeneyra
(74) *Attorney, Agent, or Firm* — Nixon Peabody LLP; Zhou Lu (57) ABSTRACT

A liftable and lockable fan is provided. The fan includes: a housing having a side wall; a tab mounted in the side wall, including an upwardly extending lower portion, an outwardly facing locking projection above the lower portion, and an inwardly facing surface above the outwardly facing locking projection; the tab having a first tab position in which the outwardly facing locking projection extends from the side wall and is configured to engage with an exterior locking surface, and a second tab position in which the outwardly facing locking projection is at least partially retracted into the housing; the housing having a recess above the outwardly facing locking projection; and a top cover rotatably mounted to the housing, including a handle on a first end of the cover, an arm on a second end of the cover.

10 Claims, 14 Drawing Sheets

(56) References Cited

U.S. PATENT DOCUMENTS

| | | | | |
|---|---|---|---|---|
| 6,556,437 | B1* | 4/2003 | Hardin | H05K 7/20172 361/679.48 |
| 6,592,327 | B2* | 7/2003 | Chen | F04D 25/166 415/213.1 |
| 7,771,165 | B2* | 8/2010 | Chen | F04D 29/601 174/252 |
| 8,727,750 | B2* | 5/2014 | Lu | F04D 29/601 417/423.14 |
| 2002/0086574 | A1* | 7/2002 | Vinson | H01R 13/745 439/247 |
| 2003/0221291 | A1* | 12/2003 | Stewart | H05K 7/20172 16/422 |
| 2006/0268514 | A1 | 11/2006 | Fan et al. | |
| 2010/0108847 | A1* | 5/2010 | Li | G06F 1/20 248/309.1 |
| 2010/0232976 | A1* | 9/2010 | Li | G06F 1/20 416/244 R |
| 2012/0027580 | A1* | 2/2012 | Lu | F04D 25/0613 415/214.1 |
| 2012/0257999 | A1* | 10/2012 | Hsieh | F04D 25/0613 417/423.14 |
| 2014/0027604 | A1* | 1/2014 | Gong | H05K 7/20172 248/672 |

\* cited by examiner

QUICK RELEASE FAN MODULE

CROSS REFERENCE TO RELATED APPLICATIONS

The instant application claims priority to U.S. Provisional Application No. 62/202,500, filed Aug. 7, 2015, entitled QUICK RELEASE FAN MODULE WITH MINIMAL SPACE, the contents of which are incorporated by reference herein in its entirety.

FIELD OF THE INVENTION

The various embodiments described herein relate generally to a fan for an electronic component. More specifically, various embodiments herein relate to a fan for an electronic component with a cover that can both lift the fan and disengage it from a supporting fan chassis.

BACKGROUND

Electronic devices typically generate heat during operation due to the flow of electricity through the device. Some electronic components are susceptible to damage if this heat is not removed. Consequently, various methods have been developed to remove heat from within electronic devices and/or electronic components. Passive methods use natural convection to remove heat. For example, the electronic device may have a housing with vents to let cool air flow into the device and hot air flow out. Other electronic devices use active methods, such as electric fans built into the housing, to provide a flow of cooling air through the device.

The processors in many processor-based devices are susceptible to heat damage. Consequently, at least one cooling fan usually is needed to remove the heat from the processor to prevent the processor from being damaged. For example, a typical home computer has a cooling fan to remove the heat produced by the electronic components, including the processor, housed therein. In other computer systems, several fans may be used to remove heat from within the device. In mission critical systems, such as servers, redundant fans may be provided that are operable to respond when another fan fails, either by initiating operation or by increasing speed.

Several different sizes and types of fans may be used in electronic devices, such as processor-based devices. Unfortunately, each type of fan typically requires its own unique method of installation. In addition, the securing methods may involve numerous parts, such as threaded fasteners. Furthermore, these fans typically are bulky and may not be disposed in a space-efficient side-by-side arrangement. Alternatively, fan connectors and finger guards may be oriented in such a manner that they interfere with the flow of air through the fan or otherwise add to the difficulty of installing the fan.

SUMMARY OF THE INVENTION

According to an embodiment of the invention, a liftable and lockable fan is provided. The fan includes: a housing having a side wall; a tab mounted in the side wall, including an upwardly extending lower portion, an outwardly facing locking projection above the lower portion, and an inwardly facing surface above the outwardly facing locking projection; the tab having a first tab position in which the outwardly facing locking projection extends from the side wall and is configured to engage with an exterior locking surface, and a second tab position in which the outwardly facing locking projection is at least partially retracted into the housing; the housing having a recess above the outwardly facing locking projection; a top cover rotatably mounted to the housing, including a handle on a first end of the cover, an arm on a second end of the cover; wherein the top cover has a first cover position in which the arm is in the recess and the tab is in the first tab position, and a second cover position in which the cover extends upward to (a) allow the fan to be lifted by the handle, and (b) the arm pressures the tab from the first tab position to the second tab position.

The above embodiment may have various optional features. The cover may be rotatably mounted to the housing. The tab may be integral with the side wall or rotatably mounted on the side wall. The cover may include an upper plate, a flange and the arm, wherein when the cover is in the second cover position, the arm contacts the tab and the flange contacts a top of the side wall. The fan may have a center of gravity that is offset from the side wall, wherein when the cover is in the second cover position and the fan is suspended by the cover, the weight of the fan rotates the fan away from the cover to maintain the cover in the second cover position.

According to another embodiment of the invention, a liftable and lockable fan is provided. The fan includes: a housing having a side wall; a plurality of tabs mounted in the side wall, each including an upwardly extending lower portion, an outwardly facing locking projection above the lower portion, and an inwardly facing surface above the outwardly facing locking projection; each of the tabs having a first tab position in which the outwardly facing locking projection extends from the side wall and is configured to engage with an exterior locking surface, and a second tab position in which the outwardly facing locking projection is at least partially retracted into the housing; the housing having a recess for each of the tabs above the outwardly facing locking projection; a top cover rotatably mounted to the housing, including a handle on a first end of the cover, and a plurality of arms on a second end of the cover; wherein the top cover has a first cover position in which the arms are in the recesses and the tabs are in the first tab position, and a second cover position in which the cover extends upward to (a) allow the fan to be lifted by the handle, and (b) the arms pressure the tabs from the first tab position to the second tab position.

The above embodiment may have various features. The cover may be rotatably mounted to the housing. The tabs may be integral with the side wall or rotatably mounted on the side wall. The cover may include an upper plate, a flange and the arms, wherein when the cover is in the second cover position, the arms contact the tabs and the flange contacts a top of the side wall. The fan may have a center of gravity that is offset from the side wall, wherein when the cover is in the second cover position and the fan is suspended by the cover, the weight of the fan rotates the fan away from the cover to maintain the cover in the second cover position.

Details of one or more implementations are set forth in the accompanying drawings and the description below. Other features, aspects, and potential advantages will be apparent from the description and drawings, and from the claims.

BRIEF DESCRIPTION OF THE DRAWINGS

Various embodiments in accordance with the present disclosure will be described with reference to the drawings, in which.

DETAILED DESCRIPTION

In the following description, various embodiments will be illustrated by way of example and not by way of limitation in the Figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Several definitions that apply throughout this disclosure will now be presented. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like. The term "a" means "one or more" unless the context clearly indicates a single element.

As used herein, the term "front", "rear", "left," "right," "top" and "bottom" or other terms of direction, orientation, and/or relative position are used for explanation and convenience to refer to certain features of this disclosure. However, these terms are not absolute, and should not be construed as limiting this disclosure.

Shapes as described herein are not considered absolute. As is known in the art, metal surfaces often have waves, protrusions, holes, recess, etc. to provide rigidity, strength and functionality. All recitations of shape (e.g., "U-shaped," "L-bracket") is to be considered modified by "substantially" regardless of whether expressly stated in the disclosure or claims, and specifically accounts for variations in the art as noted above.

Figure 1A:
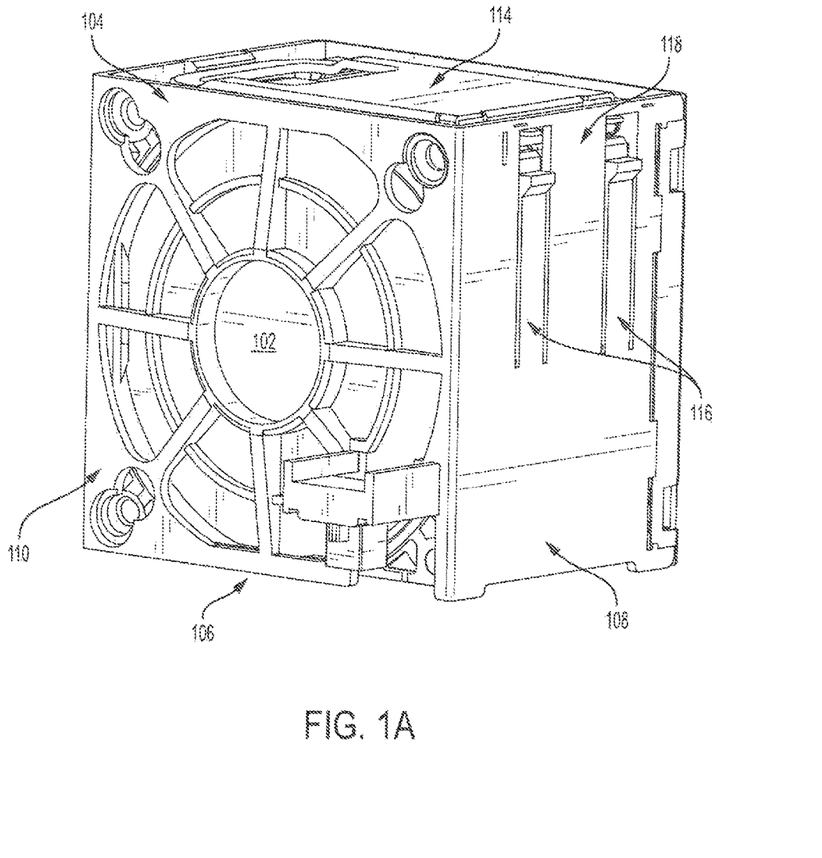
FIGS. 1A and 1B are perspective views of a fan with a retracted cover according to an embodiment of the invention.
Figure 1B:
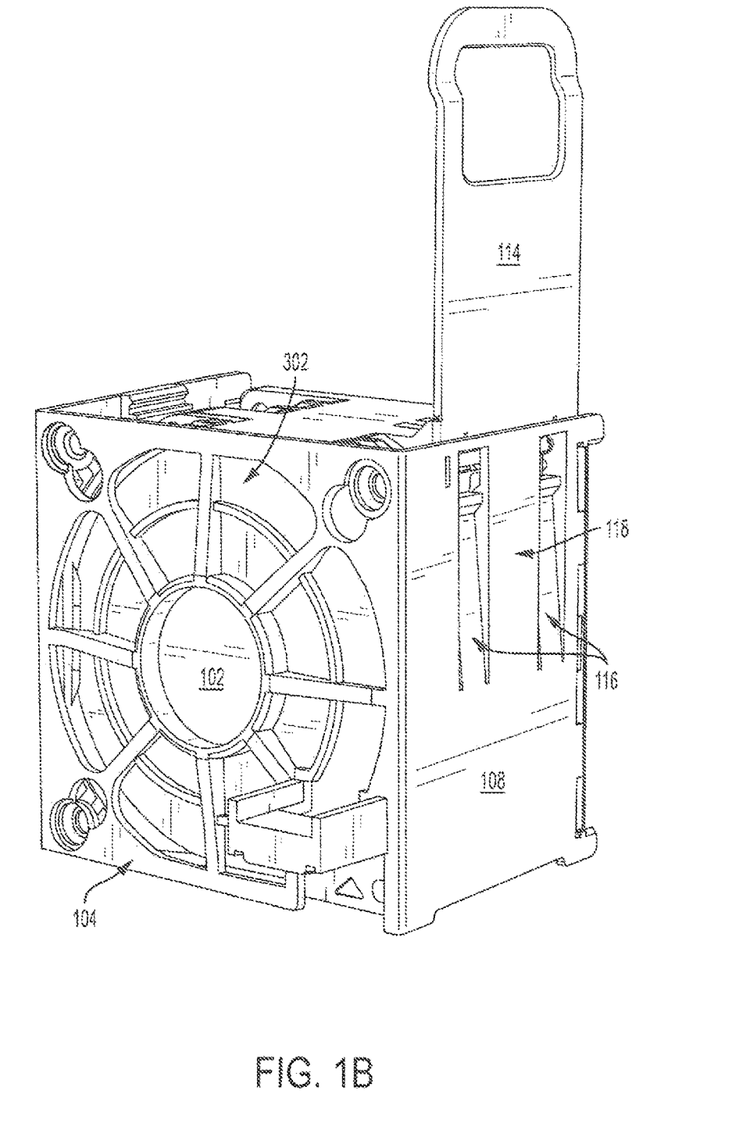

Referring now to FIGS. 1A and 1B, a fan 102 is shown. The fan 102 includes an outer housing 104 with at least a left sidewall (not shown), a bottom 106, and a right sidewall 108. The front 110 and back (not shown) are substantially open to facilitate air flow. A rotatable cover 114 is rotatable between a retracted position (FIG. 1A) that covers a top of fan 102 and a deployed position (FIG. 1B) that extends upwards from the fan 102 and acts as a handle as discussed below.

Right side wall 108 includes side tabs 116 that extend upwards. Tabs 116 are separated by an intervening portion 118 of right sidewall 108.

Figure 2A:
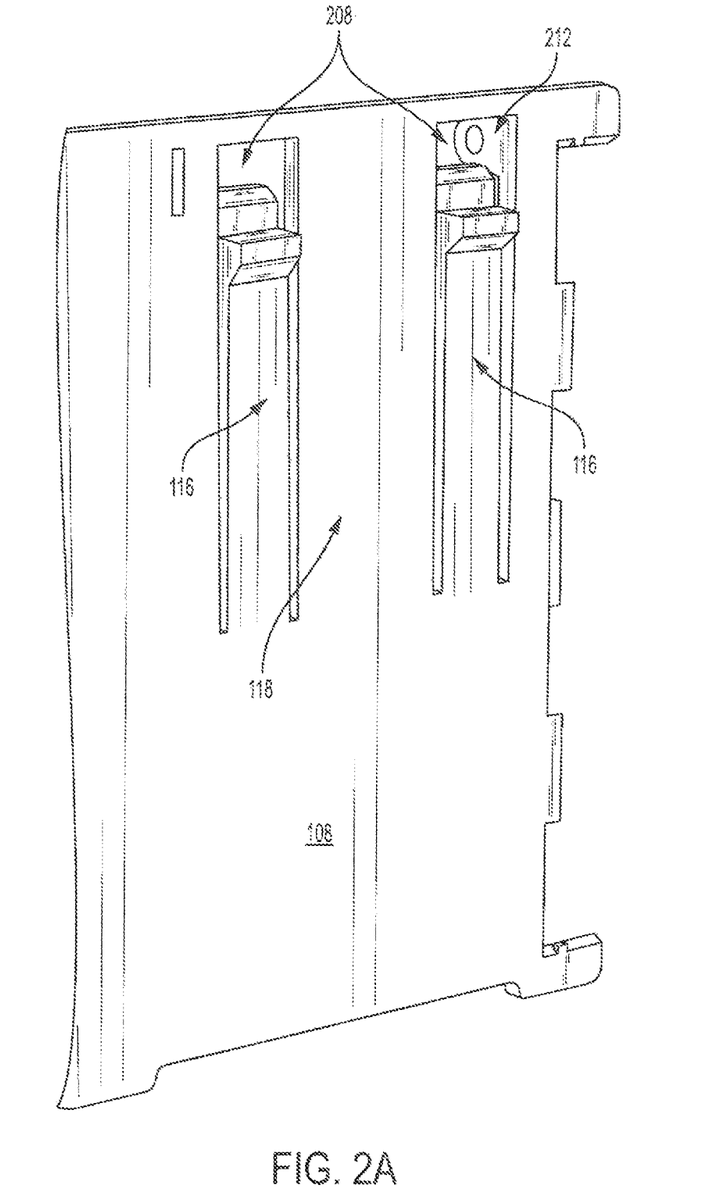
FIGS. 2A, 2B and 2C are perspectives views of a sidewall and tabs of the fan of FIG. 1 according to any embodiment of the invention.
Figure 2B:
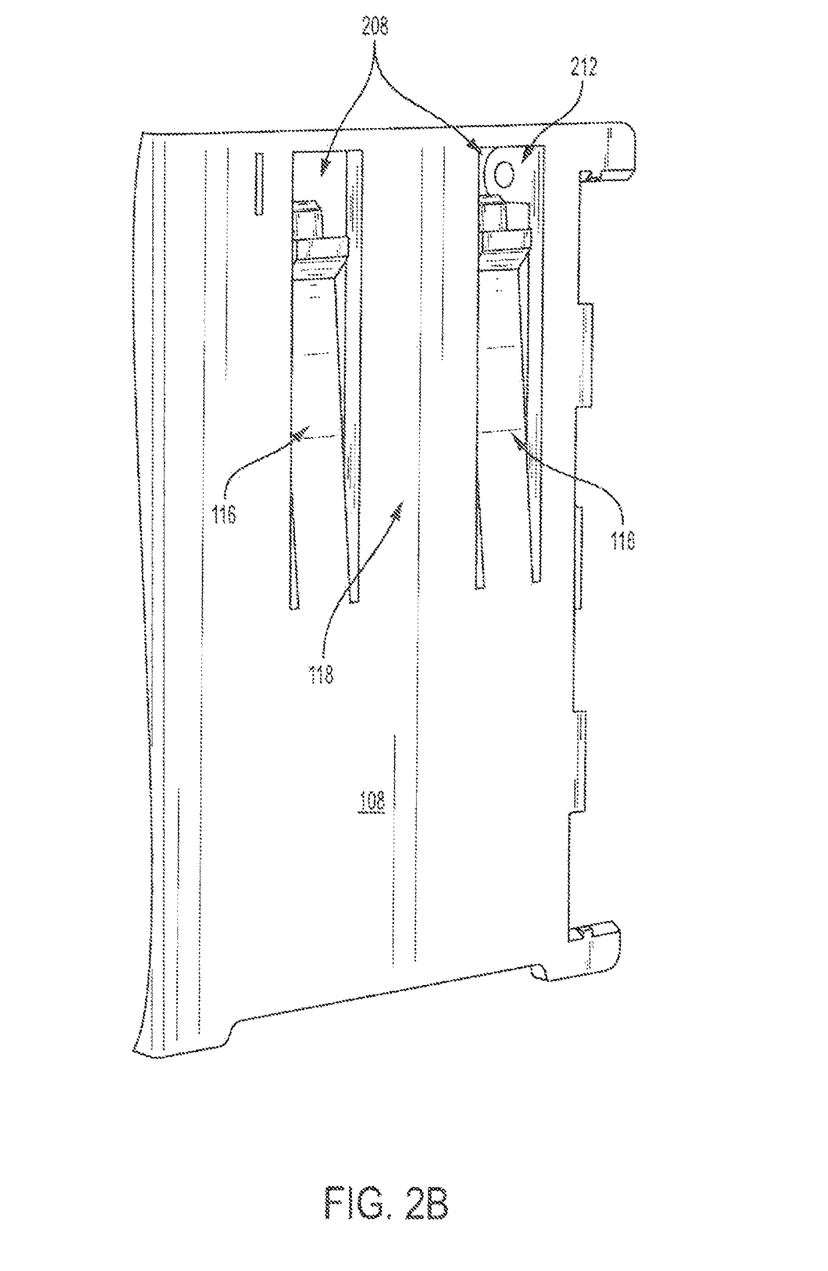
Figure 2C:
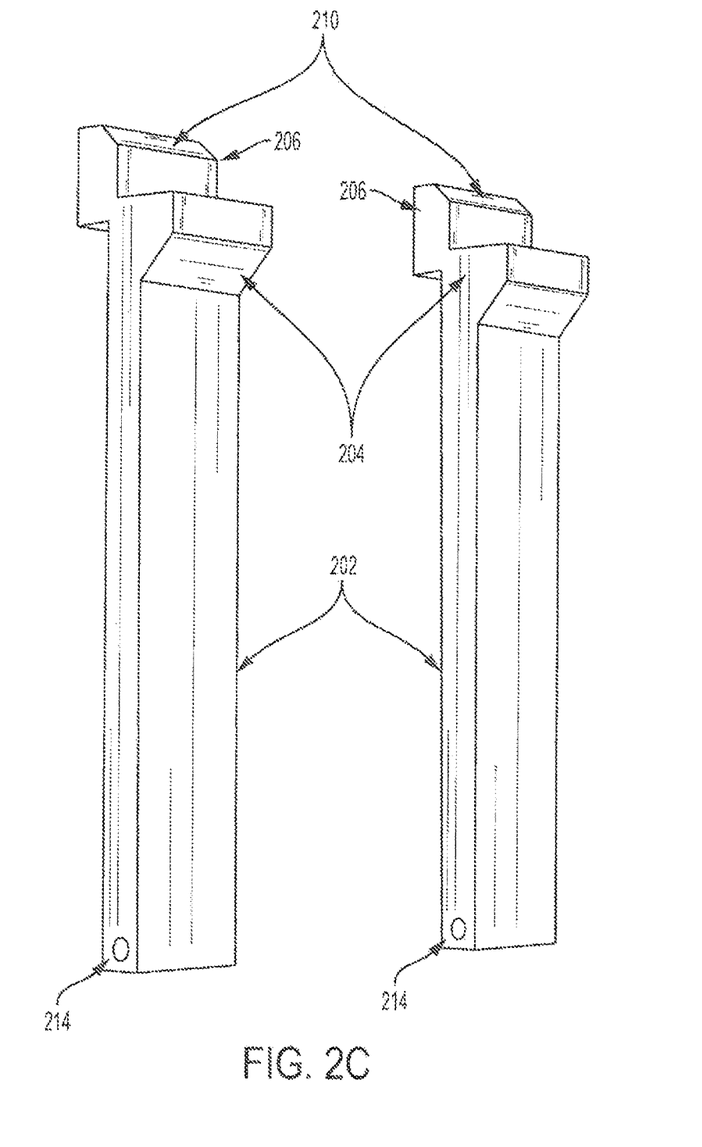

Referring now also to FIG. 2A-2C, the right sidewall 108 and tabs 116 are shown in more detail. Tabs 116 may be integral with right sidewall 108, essentially defining cut outs. Tabs 106 may have a semi rigid spring like quality that will flex slightly toward the second position under inward pressure but will tend to return to the first position when that pressure is removed. In the alternative, tabs 116 may be rotatably mounted to right sidewall 108 via a shaft (not shown) through holes 214 (FIG. 2c).

Tabs 116 each include a lower arm 202, an outwardly extending flange 204, and an inwardly extending flange 206. Inwardly extending flange 206 may have a chamfered corner 210. Right sidewall 108 has a recess 208 above each tab 116. Hinge components 212 are near the top of right sidewall 108 adjacent each recesses 208.

FIG. 2A shows tabs 116 in a first position in which lower arms 202 are generally flush with right sidewall 108, outwardly extending flanges 204 extend outward from housing 104, and inwardly extending flanges 206 are within housing 104. FIG. 2B shows tabs 116 in a second position in which tabs 116 are depressed/moved inward from right sidewall 108 into housing 104 at a slight angle; flanges 204 correspondingly at least partially extended inward into right sidewall 108, potentially so far inward that no portion of flanges 204 extend outward past right sidewall 108.

Tabs 116 are biased into the first position. The nature of the bias may in part depend on the nature of the connection of tabs 116 to right sidewall 108. If rotatably mounted, a non-limiting example of a source of the bias is a spring (e.g., spring 404 in FIG. 4C). If integrally with right sidewall 108, tabs 106 may have a semi rigid spring like quality that will flex slightly toward the second position under inward pressure but will tend to return to the first position when that pressure is removed.

Figure 3A:
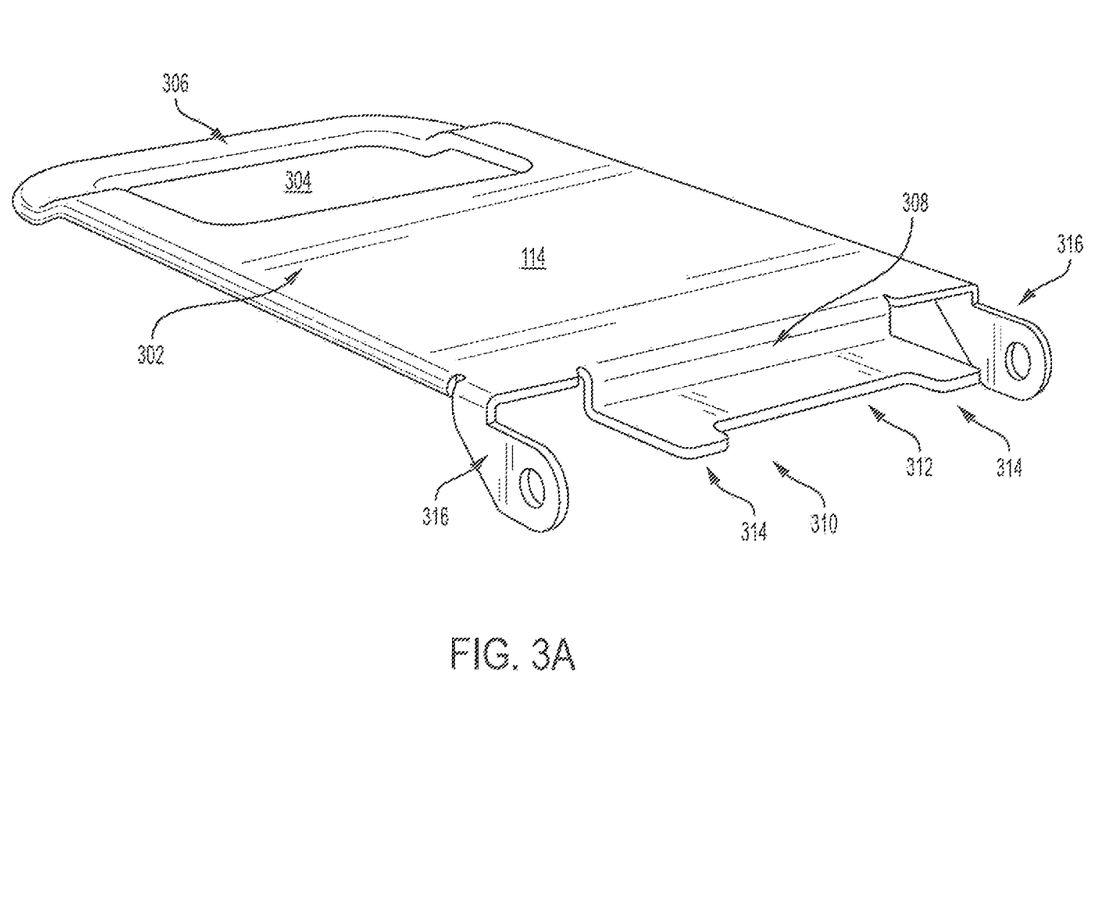
FIGS. 3A and 3B are perspectives views of a cover of the fan of FIG. 1 according to any embodiment of the invention.
Figure 3B:
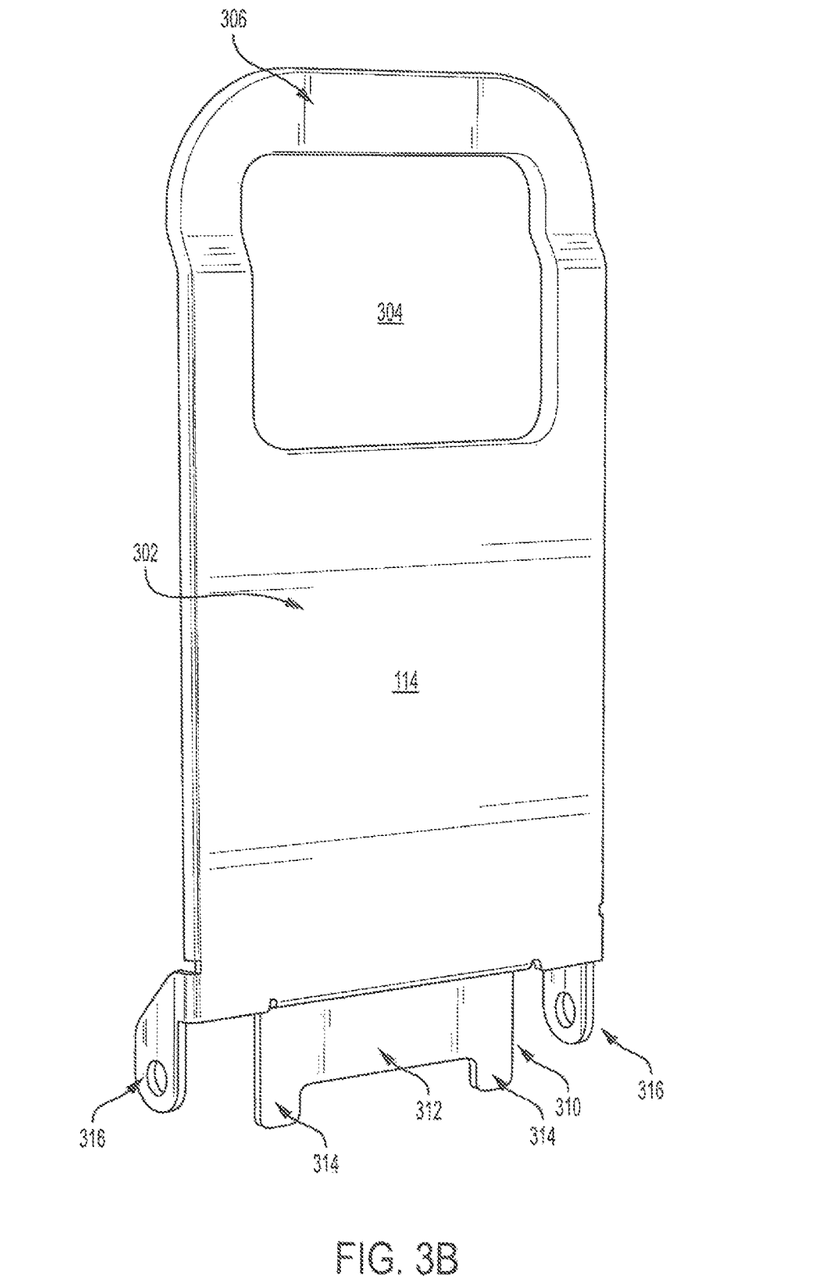

Referring now to FIGS. 3A and 3B, rotatable cover 114 is shown in more detail. FIG. 3A shows cover 114 in a retracted position and FIG. 3B shows cover 114 in a deployed position. For ease of discussion FIG. 3A is considered the reference diagram for the "top" and "bottom" of components, although as noted above these are only for purposes of explanation and do not limit the scope of the invention.

Cover 114 has an upper plate 302 with a recess 304 formed near the top to define a handle 306 large enough to be grasped by a hand or tool. An intermediate 308 flange extends from the bottom of upper plate 302. A lower plate 310 extends from intermediate flange 308. Lower plate 310 has an inverted U-shape, with a base 312 and arms 314. Hinge components 316 extend from on either side of the base of upper plate 302.

Figure 4:
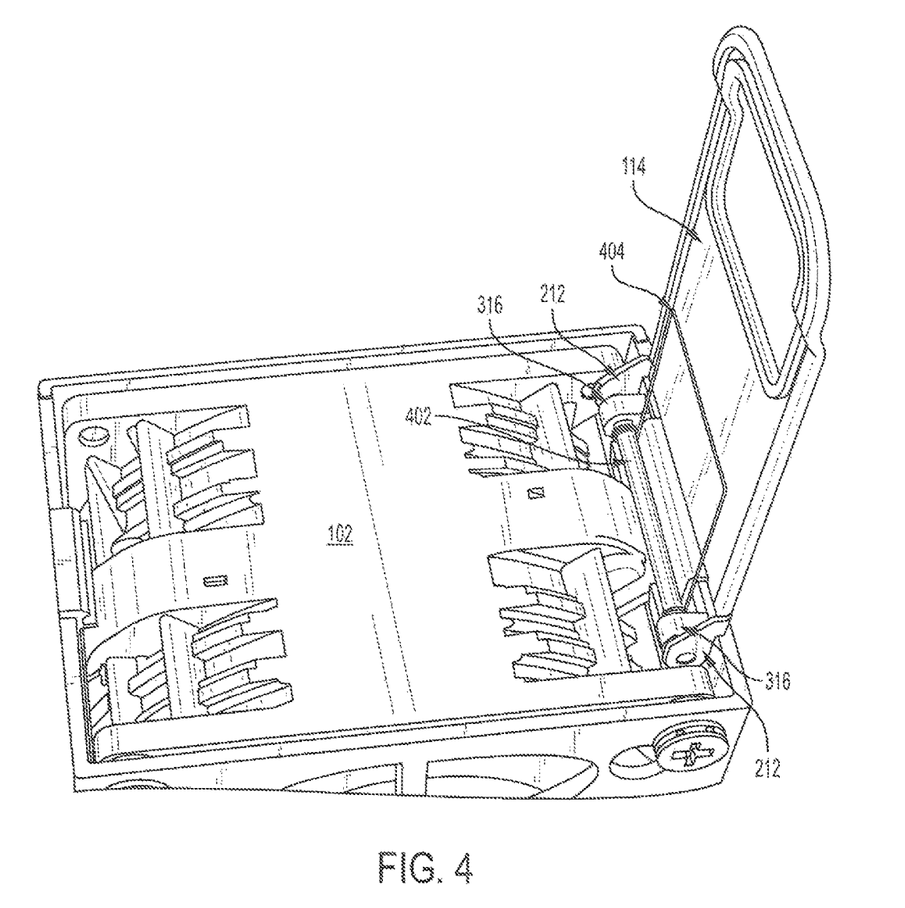
FIG. 4 is a perspective view of the fan of FIG. 1 with a deployed cover according to an embodiment of the invention.

Referring now to FIG. 4, hinge components 212 of sidewall 108 and hinge components 316 of cover 114 are coaxially mounted about a shaft 402. A user or tool can grip handle 306 against the bias of spring 404 to rotate cover 114 around the hinge components from the retracted position (FIGS. 1A/2A/3A) to the deployed position (FIG. 1A/2B/3B).

Figure 5A:
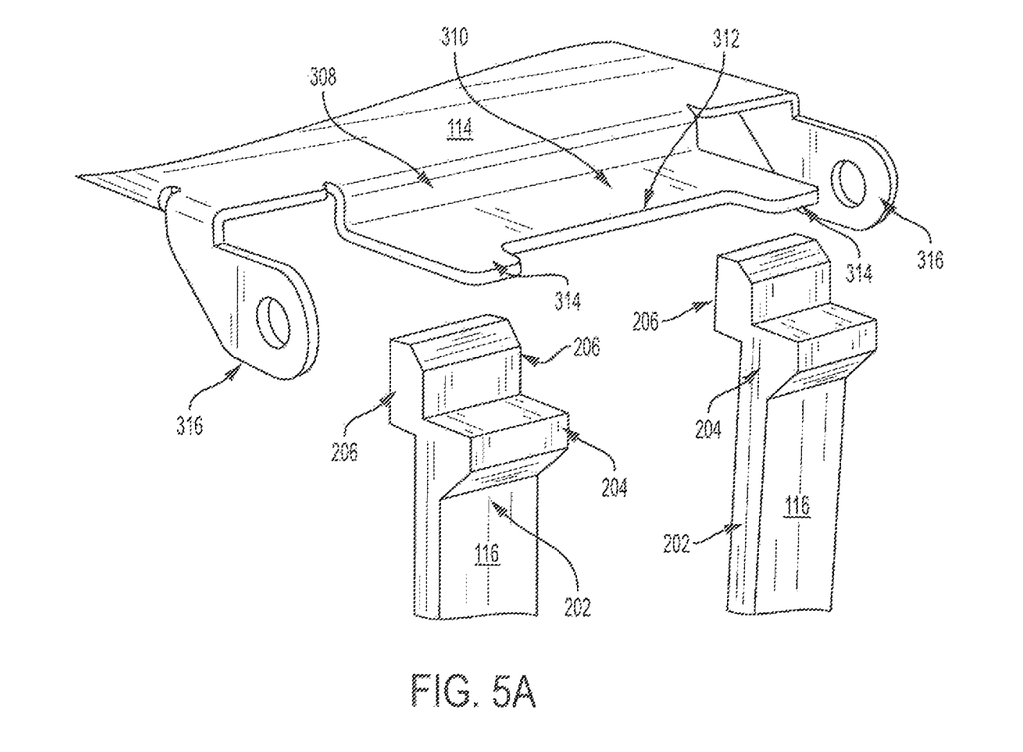
FIGS. 5A and 5B are perspective views of the cover interacting with the tabs according to an embodiment of the invention.
Figure 5B:
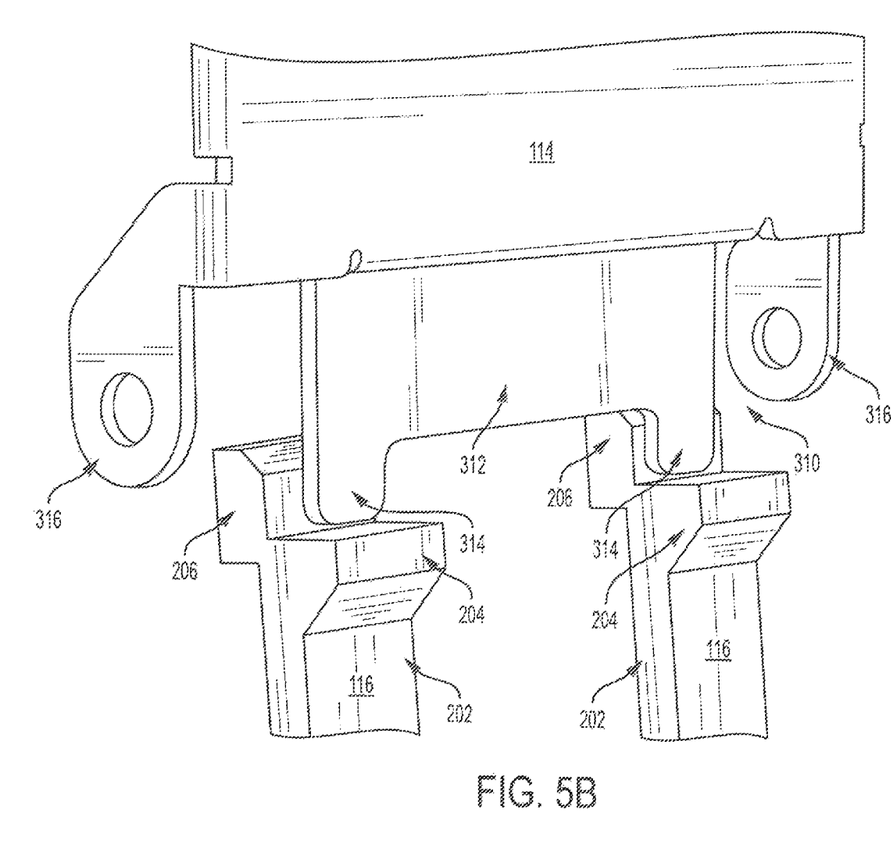

Referring now to FIGS. 5A and 5B, the interaction of cover 114 with tabs 116 is described in more detail. When cover 114 is in the retract position (FIGS. 1A/2A/3A), arms 314 of cover 114 extend into and through recesses 208 in right sidewall 108. No pressure is applied to tabs 116, and thus they are in the first position (FIG. 2A). As cover 114 rotated toward the deployed position (FIGS. 1A/2A/3A), arms 314 rotate inward into housing 104. Arms 314 ultimately engage the outer face of inwardly extending flange 206, pressuring flange 206 against the spring force of tab 116 and forcing the tabs 116 from the first position (FIG. 2A) to the second position (FIG. 2B). Cover 114 eventually engages the top portion of right sidewall 108, and specifically intermediate flange 308 and base 312 of cover 114 engage the top surface and inner side of intervening portion 118. Fan 102 can now be lifted and transported via handle 306.

The center of gravity of fan 102 is roughly coincident with the central rotating axis of fan 102. When lifted, the point of suspension from cover 114 is along the right sidewall 108. The weight of fan 102 will thus apply a rotational torque away from cover 114, thereby forcing intervening portion 118 of right sidewall 108 onto lower plate 310 of cover 114. Fan 102 will thus tend to remain in the position shown in FIG. 1A while lifted.

Figure 6:
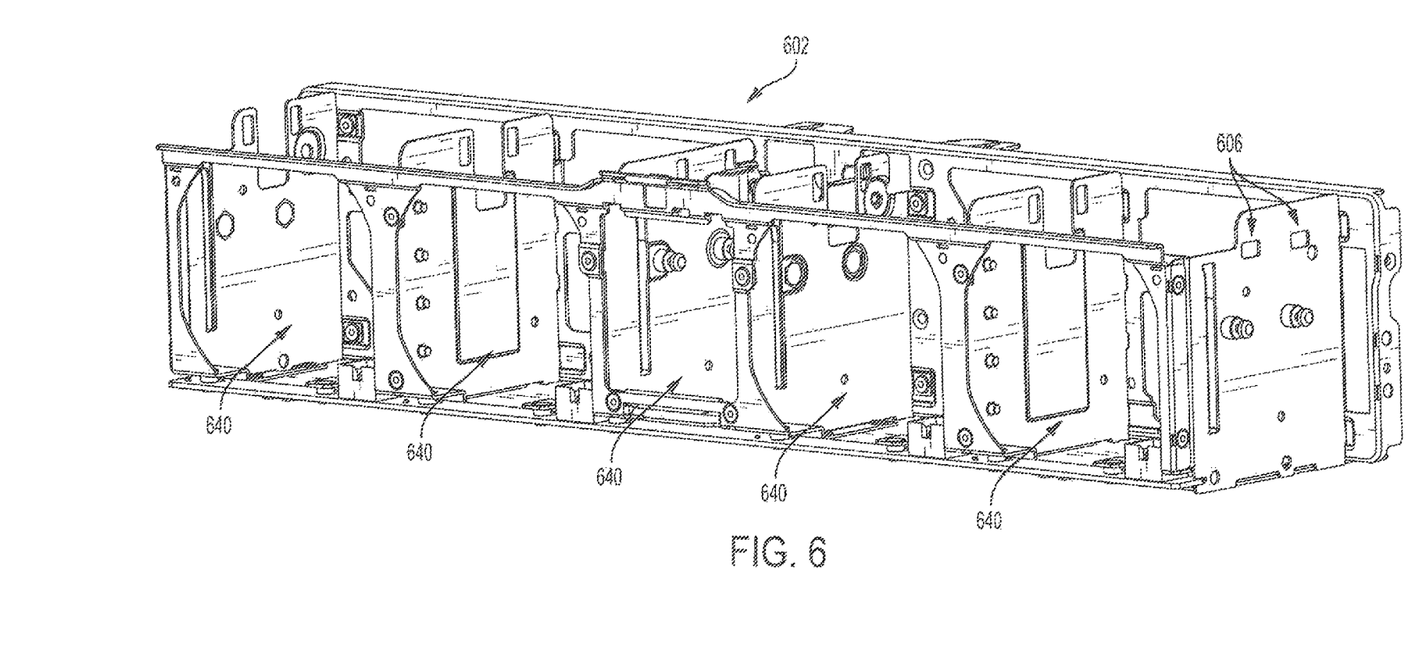
FIG. 6 is a perspective view of a fan chassis according to an embodiment of the invention.

Referring now to FIG. 6, a fan chassis 602 is shown. Fan chassis 602 includes fan receiving areas 640 configured to receive fans 102. Five fan receiving areas are shown in FIG. 6, but the invention is not so limited and any number may be provided.

Fan chassis 602 includes a side locking plate 604. Locking plate includes recesses 606, which are positioned to align with outwardly extending flanges 204 of fan 102 when inserted in fan chassis 602.

Figure 7A:
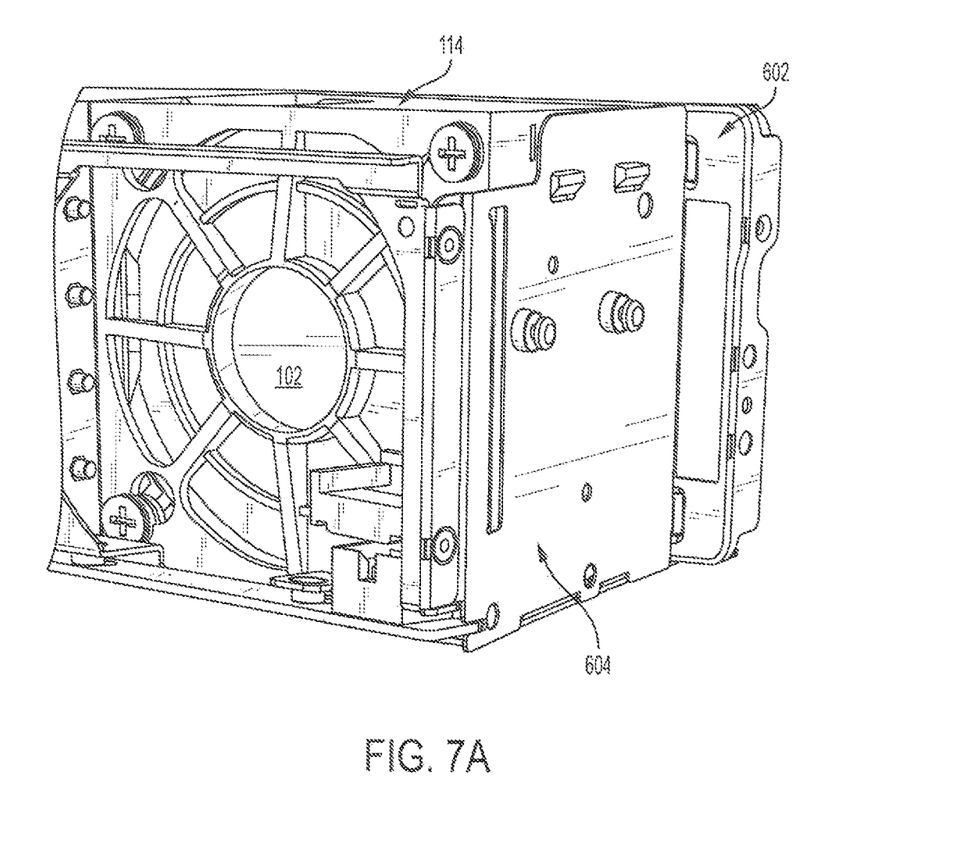
FIGS. 7A, 7B and 7C are perspectives views of the fan of FIG. 1 relative to the fan chassis of FIG. 6 according to an embodiment of the invention.

Referring now to FIG. 7A, fan chassis 602 is shown with fan 102 inserted into fan receiving area 640. Fan 102 is in its rest state, with components positioned as shown in FIGS. 1A/2A/3A/5A. Outwardly extending flanges 204 extend into recesses 606 of side locking plate 604. This engagement locks fan 102 into its corresponding fan recess 604.

Figure 7B:
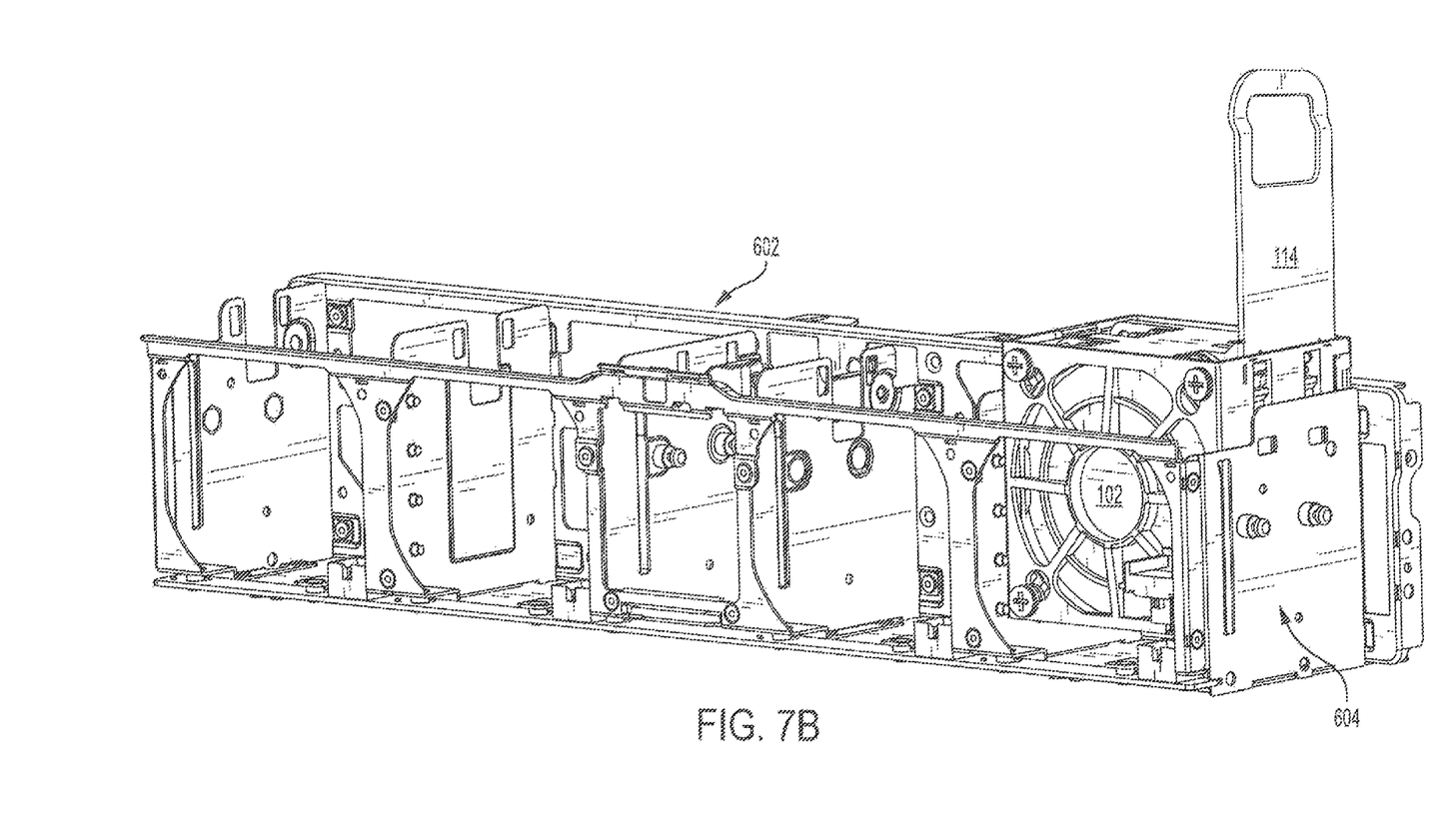
Figure 7C:
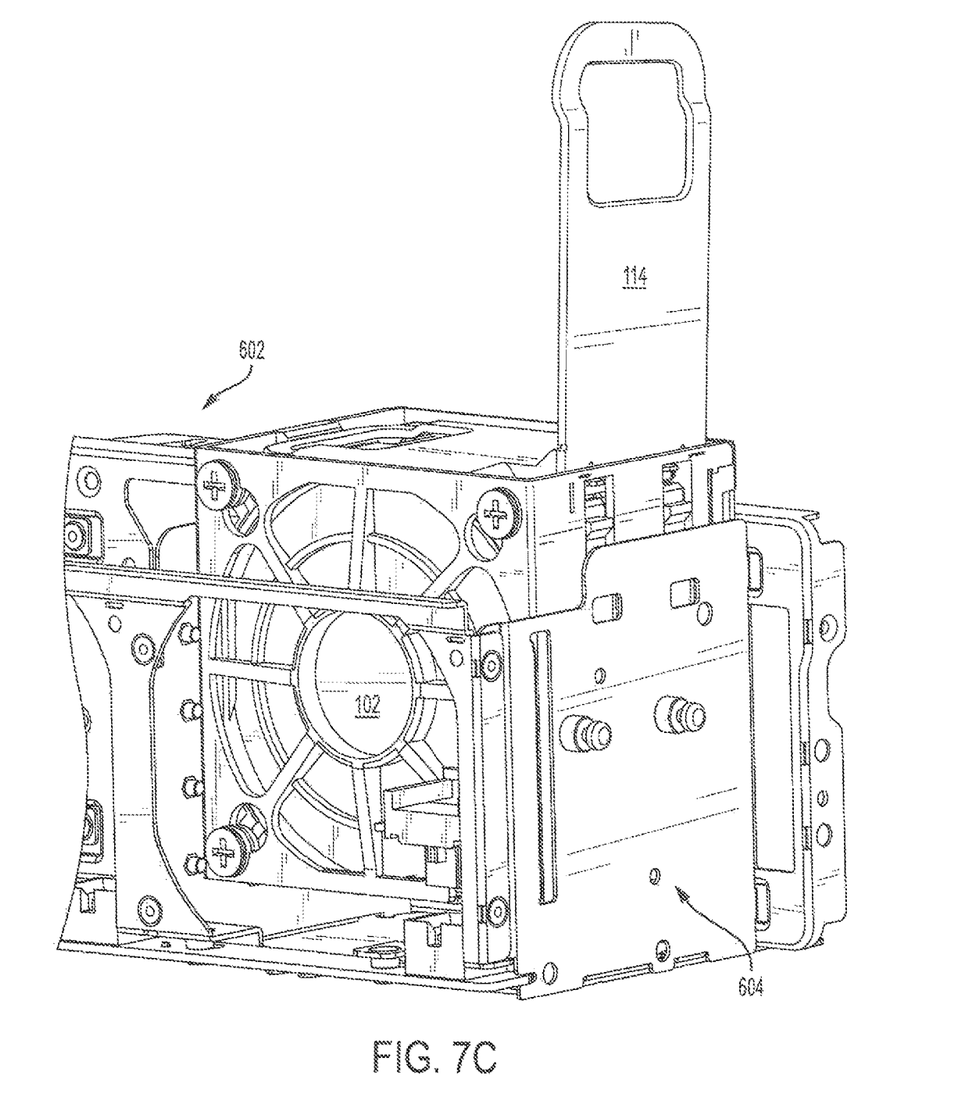

Referring now to FIG. 7B, fan chassis 602 is shown with fan 102 partially inserted therein and cover 14 rotated into the deployed position. The various components of the fan 102 will be in the positions as shown in FIGS. 1B/2B/3B/4/5B. With tabs 116 biased inward into housing 104, outwardly extending flanges 204 disengage from recesses 606. This disengagement unlocks fan 102 from fan chassis 602, whereby fan 102 can be lifted from fan chassis 602.

Fan 102 can be inserted into fan chassis 602 by one of several methods. One method is to reverse the removal sequence. The components of fan 102 will be in the positions as shown in FIGS. 1B/2B/3B/4/5B when the fan 102 is lifted. During insertion, the outwardly extending flanges 204 are retracted and do not interfere with the insertion. After fan 102 is fully inserted, cover 114 returns to the retracted position (either manually or under bias from spring 120) to the position of FIGS. 1A/2A/3A/5A. Arms 314 remove the pressure from tabs 116, which return to their first position such that outwardly extending flanges 204 engage recessed 606 to lock fan 102 in place.

A second method is to simply drop the fan with a closed cover directed into the fan recess 604. Arms 314 will not interfere with movement of tabs 116. When flanges 204 meet plate, 604, they move inward until recesses 606, which flanges 204 move into to lock fan 102 in place.

Two tabs 116 and corresponding features of fan 102 are shown. However, the invention is not so limited, and any number of tabs may be provided.

The first position of tabs 116 in FIG. 2A may be a natural rest position, but the invention is not so limited. Tabs 116 could come to rest at a point outside right sidewall 108 provides arms 314 can engage inwardly extending flange 206.

The above embodiments have been described with respect to a particular left-right orientation of components. However, the invention is not so limited, and the design could be reversed for a right-left orientation of components.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A liftable and lockable fan, comprising:
   a housing having a side wall;
   a tab mounted and integral in the side wall as a cutout, including an upwardly extending lower portion, an outwardly facing locking projection above the lower portion, and an inwardly facing surface above the outwardly facing locking projection;
   the tab having a first tab position in which the outwardly facing locking projection extends from the side wall and is configured to engage with an exterior locking surface, and a second tab position in which the outwardly facing locking projection is at least partially retracted into the housing;
   the housing having a recess above the outwardly facing locking projection;
   and
   a top cover rotatably mounted to the housing, including a handle on a first end of the cover, an arm on a second end of the cover;
   wherein the top cover has a first cover position in which the arm is in the recess and the tab is in the first tab position, and a second cover position in which the cover extends upward to (a) allow the fan to be lifted by the handle, and (b) the arm pressures the tab from the first tab position to the second tab position,
   wherein the cover includes an upper plate, a flange and the arm.

2. The fan of claim 1, wherein the cover is rotatably mounted to the housing.

3. The fan of claim 1, wherein the tab is rotatably mounted on the side wall.

4. The fan of claim 1, wherein when the cover is in the second cover position, the arm contacts the tab and the flange contacts a top of the side wall.

5. The fan of claim 1, the fan having a center of gravity that is offset from the side wall, wherein when the cover is in the second cover position and the fan is suspended by the cover, the weight of the fan rotates the fan away from the cover to maintain the cover in the second cover position.

6. A liftable and lockable fan, comprising:
   a housing having a side wall;
   a plurality of tabs mounted and integral in the side wall as a cutout, each including an upwardly extending lower portion, an outwardly facing locking projection above the lower portion, and an inwardly facing surface above the outwardly facing locking projection;
   each of the tabs having a first tab position in which the outwardly facing locking projection extends from the side wall and is configured to engage with an exterior locking surface, and a second tab position in which the outwardly facing locking projection is at least partially retracted into the housing;

the housing having a recess for each of the tabs above the outwardly facing locking projection; and a top cover rotatably mounted to the housing, including a handle on a first end of the cover, and a plurality of arms on a second end of the cover;

wherein the top cover has a first cover position in which the arms are in the recesses and the tabs are in the first tab position, and a second cover position in which the cover extends upward to (a) allow the fan to be lifted by the handle, and (b) the arms pressure the tabs from the first tab position to the second tab position, wherein the cover includes an upper plate, a flange and the arm.

7. The fan of claim 6, wherein the cover is rotatably mounted to the housing.

8. The fan of claim 6, wherein the tabs are rotatably mounted on the side wall.

9. The fan of claim 6, wherein when the cover is in the second cover position, the arms contact the tabs and the flange contacts a top of the side wall.

10. The fan of claim 6, the fan having a center of gravity that is offset from the side wall, wherein when the cover is in the second cover position and the fan is suspended by the cover, the weight of the fan rotates the fan away from the cover to maintain the cover in the second cover position.

* * * * *